United States Patent
Lee et al.

(10) Patent No.: US 9,306,008 B2
(45) Date of Patent: Apr. 5, 2016

(54) SEMICONDUCTOR DEVICE AND METHOD OF FABRICATING THE SAME

(71) Applicants: Dong-soo Lee, Gunpo-si (KR); Myoung-Jae Lee, Hwaseong-si (KR); Seong-ho Cho, Yongin-si (KR); Mohammad Rakib Uddin, Hwaseong-si (KR); David Seo, Yongin-si (KR); Moon-seung Yang, Hwaseong-si (KR); Sang-moon Lee, Yongin-si (KR); Sung-hun Lee, Yongin-si (KR); Ji-hyun Hur, Hwaseong-si (KR); Eui-chul Hwang, Seongnam-si (KR)

(72) Inventors: Dong-soo Lee, Gunpo-si (KR); Myoung-Jae Lee, Hwaseong-si (KR); Seong-ho Cho, Yongin-si (KR); Mohammad Rakib Uddin, Hwaseong-si (KR); David Seo, Yongin-si (KR); Moon-seung Yang, Hwaseong-si (KR); Sang-moon Lee, Yongin-si (KR); Sung-hun Lee, Yongin-si (KR); Ji-hyun Hur, Hwaseong-si (KR); Eui-chul Hwang, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/207,880

(22) Filed: Mar. 13, 2014

(65) Prior Publication Data
US 2015/0061088 A1 Mar. 5, 2015

(30) Foreign Application Priority Data
Sep. 3, 2013 (KR) .......................... 10-2013-0105691

(51) Int. Cl.
*H01L 21/336* (2006.01)
*H01L 29/20* (2006.01)
(Continued)

(52) U.S. Cl.
CPC .......... *H01L 29/20* (2013.01); *H01L 21/28264* (2013.01); *H01L 21/3228* (2013.01);
(Continued)

(58) Field of Classification Search
CPC ........... H01L 21/022; H01L 21/02304; H01L 21/28158; H01L 29/517; H01L 21/02175; H01L 21/02189; H01L 21/02192
USPC ................... 438/46, 763, 767, 779; 148/33.3
See application file for complete search history.

(56) References Cited

U.S. PATENT DOCUMENTS 5,147,827 A * 9/1992 Chino et al. ................... 438/767
6,483,172 B1 * 11/2002 Cote et al. ..................... 257/639
(Continued)

FOREIGN PATENT DOCUMENTS

EP  2 544 240 A1  1/2013
JP  09186396 B2  7/1997
(Continued)

OTHER PUBLICATIONS

B. Brennan, "Optimisation of the Ammonium Sulphide (NH4)2 S Passive Process on In0.53Ga0.47As", Applied Surface Science, 2010, pp. 4082-4090.
(Continued)

*Primary Examiner* — George Fourson, III
(74) *Attorney, Agent, or Firm* — Harness, Dickey & Pierce, P.L.C.

(57) ABSTRACT

The present disclosure relates to a semiconductor device including an oxygen gettering layer between a group III-V compound semiconductor layer and a dielectric layer, and a method of fabricating the semiconductor device. The semiconductor device may include a compound semiconductor layer; a dielectric layer disposed on the compound semiconductor layer; and an oxygen gettering layer interposed between the compound semiconductor layer and the dielectric layer. The oxygen gettering layer includes a material having a higher oxygen affinity than a material of the compound semiconductor layer.

18 Claims, 3 Drawing Sheets

(51) Int. Cl.
H01L 21/28 (2006.01)
H01L 29/51 (2006.01)
H01L 29/66 (2006.01)
H01L 21/322 (2006.01)
H01L 29/78 (2006.01)
H01L 29/24 (2006.01)

(52) U.S. Cl.
CPC ........ *H01L29/513* (2013.01); *H01L 29/66522* (2013.01); *H01L 29/7851* (2013.01); *H01L 29/2003* (2013.01); *H01L 29/24* (2013.01); *H01L 29/517* (2013.01); *H01L 29/518* (2013.01)

(56) References Cited

U.S. PATENT DOCUMENTS

| | | | |
|---|---|---|---|
| 8,344,418 B2 | 1/2013 | Rachmady et al. | |
| 2004/0104439 A1* | 6/2004 | Haukka | H01L 21/28088 257/368 |
| 2007/0096226 A1* | 5/2007 | Liu | H01L 29/513 257/411 |
| 2008/0261379 A1* | 10/2008 | Jinbo et al. | 438/458 |
| 2009/0014799 A1* | 1/2009 | Isobe | 257/351 |
| 2009/0152651 A1* | 6/2009 | Bu | H01L 21/28088 257/411 |
| 2010/0044806 A1* | 2/2010 | Hou | H01L 21/28176 257/412 |
| 2010/0048010 A1* | 2/2010 | Chen | H01L 21/28185 438/591 |
| 2011/0073964 A1* | 3/2011 | Chowdhury | H01L 21/823462 257/411 |
| 2011/0114992 A1* | 5/2011 | Schmid | C23C 16/0272 257/100 |
| 2012/0280372 A1* | 11/2012 | Umezawa | H01L 21/02181 257/635 |
| 2012/0292768 A1* | 11/2012 | Chang et al. | 257/751 |
| 2013/0109199 A1* | 5/2013 | Vellianitis | H01L 29/66795 438/785 |
| 2013/0270562 A1* | 10/2013 | Yamazaki | 257/57 |
| 2013/0288426 A1* | 10/2013 | Akimoto | 438/104 |
| 2014/0070208 A1* | 3/2014 | Yamazaki | H01L 27/1225 257/43 |
| 2014/0183528 A1* | 7/2014 | Endo | H01L 27/1255 257/43 |
| 2014/0198816 A1* | 7/2014 | Margalit et al. | 372/45.01 |
| 2014/0268993 A1* | 9/2014 | Chiang | G11C 13/0002 365/148 |
| 2014/0291658 A1* | 10/2014 | Muller | H01L 51/5253 257/40 |
| 2014/0326994 A1* | 11/2014 | Tanaka | 257/43 |
| 2014/0361291 A1* | 12/2014 | Sasagawa et al. | 257/43 |
| 2015/0028458 A1* | 1/2015 | Lee | H01L 21/02362 257/639 |
| 2015/0061088 A1* | 3/2015 | Lee | H01L 29/7851 257/637 |

FOREIGN PATENT DOCUMENTS

| | | |
|---|---|---|
| JP | 2001-308319 A | 11/2001 |
| JP | 2002373905 A | 12/2002 |
| JP | 2004-126770 A | 4/2004 |
| JP | 2009-302435 A | 12/2009 |
| JP | 2011-049565 A | 3/2011 |
| JP | 5 301 208 B2 | 9/2013 |
| KR | 20120032307 A | 4/2012 |

OTHER PUBLICATIONS

Arif M. Sonnet, "Impact of Semiconductor and Interface-State Capacitance on Metal/High-k/GaAs Capacitance-Voltage Characteristics", IEEE, 2010, vol. 57, No. 10, pp. 2599-2606.

Hasegawa, et al., "Unified disorder induced gap state model for insulator-semiconductor and metal-semiconductor interfaces", Journal of Vacuum Science & Technology B 4, 1130 (1986), View online: http://dx.doi.org/10.1116/1.583556.

Brennan et al., "Optimisation of the ammonium sulphide $(NH_4)_2S$ passivation process on $In_{0.53}Ga_{0.47}As$", Applied Surface Science 257 (2011) pp. 4082-4090, journal homepage: www.elsevier.com/locate/apsusc.

Hasegawa, et al., "Electronic and microstructurel properties of disorder-induced gap states at compound semiconductor-insulator interfaces", Journal of Vacuum Science & Technology B 5, 1097 (1987), view online: http://dx.doi.org/10.1116/1.583736.

Hasegawa, et al., "Control of compound semiconductor-insulator interfaces by an ultrathin molecular-beam epitaxy Si layer", Journal of Vacuum Science & Technology B 7, 870 (1989), view online: http://dx.doi.org/10.1116/1.584616.

Sonnet, et al., "Impact of Semiconductor and Interface-State Capacitance on Metal/High-k/GaAs Capacitance-Voltage Characteristics", IEEE Transactions on Electron Devices, vol. 57, No. 10, Oct. 2010, pp. 2599-2606.

Partial European Search Report mailed on Jun. 1, 2015.

T. Das et al.; "Interface Properties of Mixed $(TiO2)_{1-x}(Y2O3)_x$ and $(Ta2O5)_{1-x}(Y2O3)_x$ ($0<=x<=1$) Gate Dielectrics on Sulfur-Passivated GaAs", Journal of the Electrochemical Society, vol. 159, No. 3, Jan. 12, 2012, pp. H323-H328, XP055190477.

T. Das et al.; "Effects of Ti incorporation on the interface properties and band alignment of HfTaOx thin films on sulfur passivated GaAs", Applied Physics Letters, American Institute of Physics, US, vol. 98, No. 2, Jan. 10, 2011, pp. 22901-1 to 22901-3, XP012139166.

* cited by examiner

SEMICONDUCTOR DEVICE AND METHOD OF FABRICATING THE SAME

CROSS-REFERENCE TO RELATED APPLICATION

This application claims priority under 35 U.S.C. §119 to Korean Patent Application No. 10-2013-0105691, filed on Sep. 3, 2013 in the Korean Intellectual Property Office, the disclosure of which is incorporated herein in its entirety by reference.

BACKGROUND

1. Field

The present disclosure relates to a semiconductor device and a method of fabricating the same, and more particularly, to a semiconductor device including an oxygen gettering layer between a Group III-V compound semiconductor layer and a dielectric layer, and a method of fabricating the semiconductor device.

2. Description of the Related Art

A compound semiconductor is formed by combining at least two types of elements and therefore has a characteristic of a semiconductor. For example, a GaAs compound semiconductor using Ga and As are elements from Groups III and V of the periodic table that are generally used. A semiconductor device using a Group III-V compound semiconductor such as GaAs has an electron mobility that is at least five times higher than that of a semiconductor device using silicon, and therefore is able to operate at a high speed. Also, the semiconductor device using a Group III-V compound semiconductor is able to stably operate at a high temperature and therefore may be used in a high power apparatus. Also, the semiconductor device using a Group III-V compound semiconductor is able to operate in a high frequency band and therefore may be used in a millimeter wave or microwave apparatus or in an optoelectronic device. Also, the Group III-V compound semiconductor may emit light in a range of an infrared ray to a visible ray and therefore is widely used in a light-emitting diode (LED) or a semiconductor laser, which generates various light colors. The Group III-V compound semiconductor is also characterized for its low power consumption.

Semiconductors having various characteristics may be fabricated according to the types and composition of materials combined in the Group III-V compound semiconductor. However, compared to the silicon semiconductor, the Group III-V compound semiconductor is easily oxidized. Thus, when the Group III-V compound semiconductor forms an interface with an oxide layer, a surface of the Group III-V compound semiconductor is oxidized such that a surface roughness may increase and physical and electrical defects may occur.

SUMMARY

Additional aspects will be set forth in part in the description which follows and, in part, will be apparent from the description, or may be learned by practice of the non-limiting embodiments.

According to an example embodiment, a semiconductor device may include a compound semiconductor layer including at least one element from Groups III through VI; a dielectric layer disposed on the compound semiconductor layer; and an oxygen gettering layer interposed between the compound semiconductor layer and the dielectric layer, the oxygen gettering layer including a material having a higher affinity for oxygen than a material of the compound semiconductor layer.

The oxygen gettering layer may include at least one of a transition metal, doped Zr, a lanthanum-based metal, a metal sulfide, and a metal nitride.

The transition metal may include at least one of Ti, Sc, and Y.

The doped Zr may include at least one of Y-doped Zr and Al-doped Zr.

The metal sulfide may include at least one of $HfS_2$, $TiS_2$, $LaS_x$, and $SiS_2$.

The metal nitride may include at least one of AlN, GaN, HfN, and SiN.

A thickness of the oxygen gettering layer may be equal to or less than about 10 nm.

The dielectric layer may include at least one of $HfO_2$, $Al_2O_3$, $La_2O_3$, $ZrO_2$, HfSiO, HfSiON, HfLaO, LaAlO, and SrTiO.

The semiconductor device may further include a passivation layer interposed between the compound semiconductor layer and the oxygen gettering layer.

The passivation layer may include at least one of S, N, F, Cl and H formed on a surface of the compound semiconductor layer.

According to another example embodiment, a method of fabricating a semiconductor device may include operations of forming an oxygen gettering layer on a compound semiconductor layer, the compound semiconductor layer including at least one element from Groups III through VI, wherein the oxygen gettering layer includes a material having a higher affinity for oxygen than a material of the compound semiconductor layer; and forming a dielectric layer on the oxygen gettering layer.

The oxygen gettering layer may be formed by using an atomic layer deposition (ALD) method, a chemical vapor deposition (CVD) method, or a sputtering method.

After the operation of forming the oxygen gettering layer or the operation of forming the dielectric layer, the method may further include an operation of performing a thermal treatment.

Before the operation of forming the oxygen gettering layer on the compound semiconductor layer, the method may further include an operation of forming a passivation layer on a surface of the compound semiconductor layer.

The passivation layer may include at least one of S, N, F, Cl and H formed on a surface of the compound semiconductor layer According to another example embodiment, a semiconductor device may include a compound semiconductor layer, an oxygen gettering layer on the compound semiconductor layer, and a dielectric layer on the oxygen gettering layer. The compound semiconductor layer includes elements from at least two different groups of a periodic table. At least one of the elements may be from Groups III through VI. The oxygen gettering layer includes a material having a higher affinity for oxygen than any material of the compound semiconductor layer.

BRIEF DESCRIPTION OF THE DRAWINGS

The above and/or other aspects will become apparent and more readily appreciated when the following description is taken in conjunction with the accompanying drawings in which.

DETAILED DESCRIPTION

Figure 1:
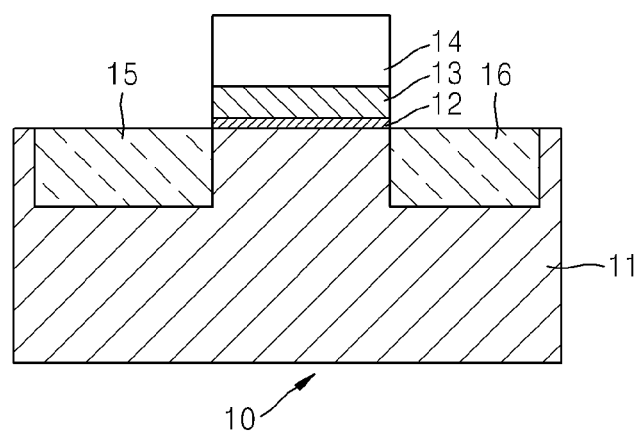
FIG. 1 is a cross-sectional view illustrating a structure of a compound semiconductor device according to an example embodiment.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Reference will now be made in further detail to example embodiments of a semiconductor device and a method of fabricating the semiconductor device. In the accompanying drawings, the size of each component may have been exaggerated for clarity. In this regard, it should be understood that the examples may have different forms and should not be construed as being limited to the descriptions set forth herein. Expressions such as "at least one of," when preceding a list of elements, modify the entire list of elements and are not limited to a particular element.

FIG. 1 is a cross-sectional view illustrating a structure of a compound semiconductor device 10 according to an example embodiment. Referring to FIG. 1, the compound semiconductor device 10 may include a compound semiconductor layer 11, a dielectric layer 13 disposed on the compound semiconductor layer 11, and an oxygen gettering layer 12 interposed between the compound semiconductor layer 11 and the dielectric layer 13. Also, the compound semiconductor device 10 may further include source and drain regions 15 and 16 formed by doping top portions of the compound semiconductor layer 11 at both sides of the dielectric layer 13, and an electrode 14 disposed on the dielectric layer 13. The electrode 14 may be a gate electrode.

The compound semiconductor device 10 shown in FIG. 1 may be used in a metal oxide semiconductor field-effect transistor (MOSFET). However, the MOSFET is merely an example of the compound semiconductor device 10. Thus, it should be understood that the present embodiment is not limited to the MOSFET. For example, the compound semiconductor device 10 according to the present embodiment may be applied to various types of transistors, capacitors, light-emitting devices, photo sensors, modulators, solar cells, integrated circuits, or the like in which the dielectric layer 13 and the compound semiconductor layer 11 may form an interface. Also, referring to FIG. 1, the electrode 14 is disposed on the dielectric layer 13 but the present embodiment is not limited thereto. Thus, a layer other than the electrode 14 may be disposed on the dielectric layer 13, according to a type and structure of the compound semiconductor device 10.

The compound semiconductor layer 11 may include Ga and In from Group III, As and P from Group V, or a chalcogenide from Group VI. For example, the compound semiconductor layer 11 may include GaN, GaAs, InGaAs, InP, or the like. The dielectric layer 13 may include $SiO_2$, but in order to assure a sufficient electrostatic capacity and thickness, the dielectric layer 13 may be formed of a high-k dielectric material. For example, the dielectric layer 13 may be formed as a metal oxide dielectric layer including the high-k dielectric material such as $HfO_2$, $Al_2O_3$, $La_2O_3$, $ZrO_2$, HfSiO, HfSiON, HfLaO, LaAlO, SrTiO, or the like.

The electrode 14 disposed on the dielectric layer 13 may include metal such as platinum (Pt). The source and drain regions 15 and 16 may be formed by doping the top portions of the compound semiconductor layer 11 at both sides of the dielectric layer 13. For example, when the compound semiconductor layer 11 is doped n-type, the source and drain regions 15 and 16 may be doped p-type. Conversely, when the compound semiconductor layer 11 is doped p-type, the source and drain regions 15 and 16 may be doped n-type.

However, because the compound semiconductor layer 11 has a relatively low thermal stability and is prone to become oxidized, when the dielectric layer 13 and the compound semiconductor layer 11 directly form an interface, a characteristic of the interface may deteriorate. That is, while the dielectric layer 13 is formed on the compound semiconductor layer 11, a surface of the compound semiconductor layer 11 may be oxidized, and in the processes thereafter, an element of the compound semiconductor layer 11 may diffuse to the dielectric layer 13 due to exposure to a high temperature. For example, when the compound semiconductor layer 11 includes GaAs, GaAs in the surface of the compound semiconductor layer 11 may react with oxygen such that $Ga_2O_3$ may be generated and an As element may become separated. The separated As element may diffuse to the dielectric layer 13 during a high temperature process, which may thus deteriorate a dielectric characteristic of the dielectric layer 13. Due to this, crystal defects may occur at the interface between the compound semiconductor layer 11 and the dielectric layer 13, and current leakage and deterioration in electron mobility may occur.

According to the present embodiment, in order to prevent the compound semiconductor layer 11 and the dielectric layer 13 from directly forming the interface therebetween, the oxygen gettering layer 12 may be interposed between the compound semiconductor layer 11 and the dielectric layer 13. The oxygen gettering layer 12 may be oxidized by itself by absorbing oxygen in the interface between the compound semiconductor layer 11 and the dielectric layer 13, so that the oxygen gettering layer 12 may function as an oxygen diffusion preventing layer for preventing diffusion of oxygen from the dielectric layer 13 and may simultaneously function as an oxidization preventing layer for suppressing oxidization of the compound semiconductor layer 11.

Also, the oxygen gettering layer 12 may be formed of a material having desirable interfacial characteristics after oxidization and having compact layer characteristics. Thus, the oxidized oxygen gettering layer 12 may prevent oxygen from penetrating into the compound semiconductor layer 11 and may prevent mutual diffusion of elements between the compound semiconductor layer 11 and the dielectric layer 13. Also, the oxygen gettering layer 12 may be formed of a material having a relatively high dielectric constant after oxidization, so that the oxygen gettering layer 12 does not affect a high-k dielectric characteristic of the dielectric layer 13. Therefore, the oxygen gettering layer 12 may be regarded as a dielectric layer. That is, the dielectric layer 13 may be regarded as having a double-layer structure including the oxidized oxygen gettering layer 12 and the high-k dielectric material.

Figure 2A:
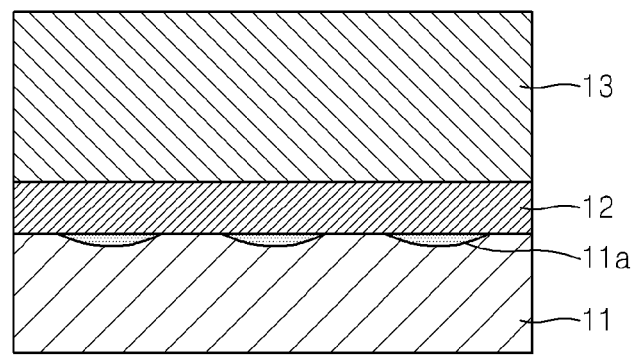
FIGS. 2A and 2B are cross-sectional views illustrating a function of an oxygen gettering layer interposed between a compound semiconductor layer and a dielectric layer.
Figure 2B:
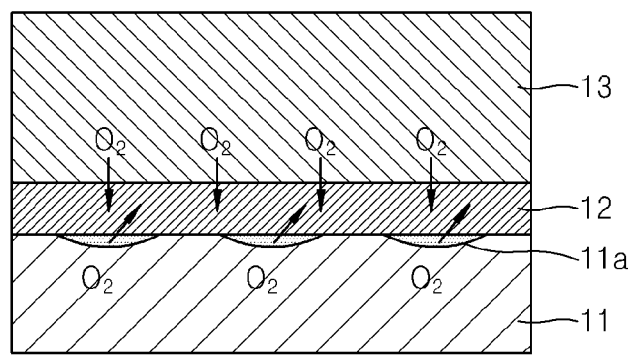

FIGS. 2A and 2B are cross-sectional views illustrating a function of the oxygen gettering layer 12 interposed between the compound semiconductor layer 11 and the dielectric layer 13. Referring to FIG. 2A, a plurality of pieces of interfacial oxide 11a that are generated due to oxidization of a portion of a compound semiconductor may be on a top surface of the compound semiconductor layer 11. For example, the interfacial oxide 11a may be $Ga_2O_3$. The oxygen gettering layer 12 has a relatively high oxygen affinity. In a non-limiting embodiment, the oxygen gettering layer 12 includes a material that has a higher affinity for oxygen than any material of the compound semiconductor layer 11 and/or the dielectric layer 13. Thus, as illustrated in FIG. 2B, the oxygen gettering layer 12 may be oxidized itself by absorbing the oxygen from the compound semiconductor layer 11 and the dielectric layer 13. Then, the interfacial oxide 11a may be deoxidized to again become part of the compound semiconductor. For example, $Ga_2O_3$ may be deoxidized to become GaAs. Thus, the interfacial oxide 11a and residual oxygen between the compound semiconductor layer 11 and the dielectric layer 13 may be removed.

The oxygen gettering layer 12 may be formed of a material including a transition metal such as Ti, Sc, Y, etc., a doped metal such as Y-doped Zr, Al-doped Zr, etc., a lanthanum-based metal having a high dielectric constant after oxidization, a metal sulfide such as $HfS_2$, $TiS_2$, $LaS_x$, $SiS_2$, etc., or a metal nitride such as AlN, GaN, HfN, SiN, etc. The doped metal may be obtained by doping a metal having a high dielectric constant after oxidization to a metal that is easily oxidized. Here, a composition of the metal for the oxygen gettering layer 12 and a thickness of the oxygen gettering layer 12 may vary according to a condition of a subsequent process (e.g., a condition of a thermal treatment), a material, composition, and a state of a crystal plane of the compound semiconductor layer 11, a material and composition of the dielectric layer 13, or the like. When the oxygen gettering layer 12 is oxidized, the oxygen gettering layer 12 may have a dielectric function so that the thickness of the oxygen gettering layer 12 may be equal to or less than about 10 nm so as to decrease its influence on a characteristic of the dielectric layer 13. The oxygen gettering layer 12 may be formed on the compound semiconductor layer 11 by using various methods such as an atomic layer deposition (ALD) method, a chemical vapor deposition (CVD) method, or a sputtering method. Alternatively, in order to accelerate oxidization of the oxygen gettering layer 12, a thermal treatment process may be performed after the oxygen gettering layer 12 is deposited or after the dielectric layer 13 is deposited.

Figure 3:
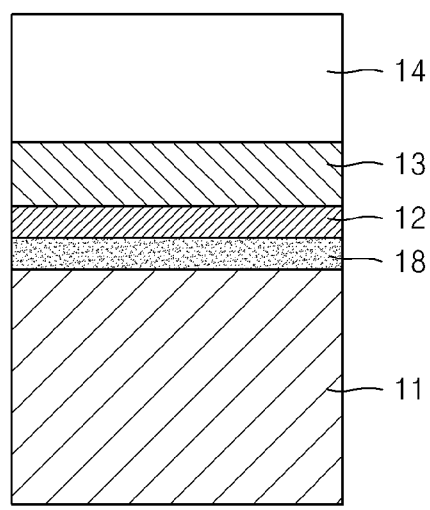
FIG. 3 is a cross-sectional view schematically illustrating only an interface between the compound semiconductor layer and the dielectric layer of the compound semiconductor device, according to another example embodiment.

FIG. 3 is a cross-sectional view schematically illustrating only an interface between the compound semiconductor layer 11 and the dielectric layer 13 of the compound semiconductor device 10, according to another example embodiment. Referring to FIG. 3, a passivation layer 18, the oxygen gettering layer 12, the dielectric layer 13, and the electrode 14 may be sequentially stacked in this order on the compound semiconductor layer 11. Compared to FIG. 1, the compound semiconductor device 10 of FIG. 3 may further include the passivation layer 18 between the compound semiconductor layer 11 and the oxygen gettering layer 12.

The passivation layer 18 may be formed in a manner that Group III or V elements on a surface of the compound semiconductor layer 11 are substituted for elements such as S, N, F, Cl, H, or the like. That is, the passivation layer 18 may be a layer that is thinly coated with S, N, F, Cl, H, or the like on the surface of the compound semiconductor layer 11. The passivation layer 18 may increase the Gibbs free energy and therefore may suppress that the surface of the compound semiconductor layer 11 is oxidized in an oxygen atmosphere. By using both the passivation layer 18 and the oxygen gettering layer 12, it is possible to suppress the oxidization of the compound semiconductor layer 11 and the mutual diffusion of elements between the compound semiconductor layer 11 and the dielectric layer 13.

As described above, the oxygen gettering layer 12 may remove oxygen in the interface between the compound semiconductor layer 11 and the dielectric layer 13, so that the oxygen gettering layer 12 may function as an oxygen diffusion preventing layer for preventing diffusion of oxygen from the dielectric layer 13 and may simultaneously function as an oxidization preventing layer for suppressing the oxidization of the compound semiconductor layer 11. Also, in general, the oxygen gettering layer 12 has beneficial interfacial characteristics, a relatively high dielectric constant, and a compact layer characteristic, so that the oxygen gettering layer 12 may improve an interfacial characteristic of the compound semiconductor layer 11. Thus, the oxygen gettering layer 12 may improve electrical characteristics of the compound semiconductor device 10.

For example, a small subthreshold swing (SS) is available in an FET, so that a high Ion/Ioff ratio may be realized. Also, a deterioration of a capacitance characteristic in an accumulation region of a MOS capacitor may be reduced or prevented. Also, a deterioration of carrier mobility at the interface may be reduced or prevented so that a driving speed may be improved, and an off leakage current may be decreased so that a power consumption may be reduced.

Figure 4:
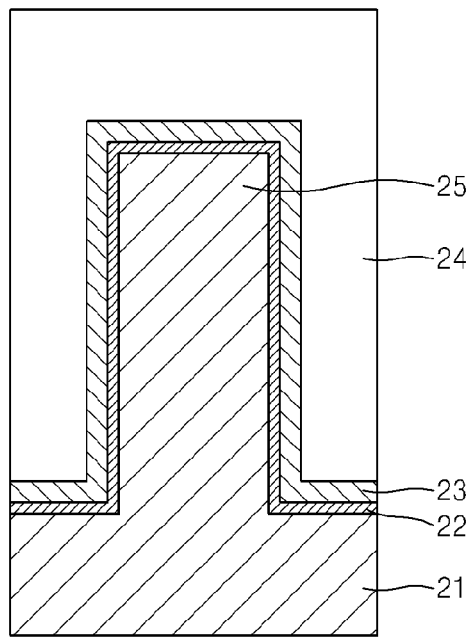
FIG. 4 is a cross-sectional view schematically illustrating only an interface between a compound semiconductor layer and a dielectric layer of a compound semiconductor device, according to another example embodiment.
Figure 5:
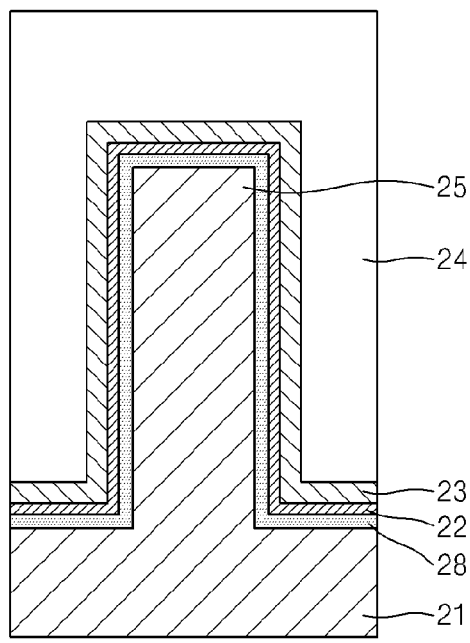
FIG. 5 is a cross-sectional view schematically illustrating only an interface between the compound semiconductor layer and the dielectric layer of the compound semiconductor device, according to another example embodiment.

In FIGS. 1-3, the compound semiconductor layer 11, the oxygen gettering layer 12 and the dielectric layer 13 are shown as being planar. However, the aforementioned embodiments may be applied to any shape. FIGS. 4 and 5 illustrate examples in which the aforementioned embodiments are applied to a fin field effect transistor (FinFET) to improve a channel controllability for each unit area. FIGS. 4 and 5 are cross-sectional views wherein each schematically illustrates only an interface between a compound semiconductor layer 21 and a dielectric layer 23, according to example embodiments.

First, referring to FIG. 4, the compound semiconductor layer 21 may include a channel region 25 as a center portion that protrudes vertically. Then, an oxygen gettering layer 22 and the dielectric layer 23 may be formed to surround an external surface of the compound semiconductor layer 21, including the channel region 25, and an electrode 24 may be formed on a surface of the dielectric layer 23. Except for cross-sectional shapes, materials and functions related to the compound semiconductor layer 21, the oxygen gettering layer 22, and the dielectric layer 23 may be the same as those that were described above with reference to FIG. 1. Also, as illustrated in FIG. 5, a passivation layer 28 formed of S, N, F, Cl, H, or the like may be further interposed between the compound semiconductor layer 21 and the oxygen gettering layer 22.

The semiconductor device and the method of fabricating the semiconductor device are described above according to various example embodiments with reference to the accompanying drawings. However, it should be understood that the example embodiments described herein should be considered in a descriptive sense only and not for purposes of limitation. Descriptions of features or aspects within each embodiment should typically be considered as available for other similar features or aspects in other embodiments.

What is claimed is:
1. A semiconductor device comprising:
  a compound semiconductor layer comprising at least one element from Groups III through VI;
  a dielectric layer disposed on the compound semiconductor layer;
  an oxygen gettering layer interposed between the compound semiconductor layer and the dielectric layer, the oxygen gettering layer comprising a material having a higher affinity for oxygen than a material of the compound semiconductor layer, the oxygen gettering layer including at least one of a doped Zr, a metal sulfide, and a metal nitride; and
  an electrode on the dielectric layer, the dielectric layer being between the electrode and the oxygen gettering layer.

2. The semiconductor device of claim 1, wherein the doped Zr comprises at least one of Y-doped Zr and Al-doped Zr.

3. The semiconductor device of claim 1, wherein the metal sulfide comprises at least one of $HfS_2$, $TiS_2$, $LaS_x$, and $SiS_2$.

4. The semiconductor device of claim 1, wherein the metal nitride comprises at least one of AlN, GaN, HfN, and SiN.

5. The semiconductor device of claim 1, wherein a thickness of the oxygen gettering layer is equal to or less than about 10 nm.

6. The semiconductor device of claim 1, wherein the dielectric layer comprises at least one of $HfO_2$, $Al_2O_3$, $La_2O_3$, $ZrO_2$, HfSiO, HfSiON, HfLaO, LaAlO, and SrTiO.

7. The semiconductor device of claim 1, further comprising:
  a passivation layer interposed between the compound semiconductor layer and the oxygen gettering layer.

8. The semiconductor device of claim 7, wherein the passivation layer comprises at least one of S, N, F, Cl and H formed on a surface of the compound semiconductor layer.

9. A method of fabricating a semiconductor device, the method comprising:
  forming an oxygen gettering layer on a compound semiconductor layer, the compound semiconductor layer comprising at least one element from Groups III through VI, the oxygen gettering layer comprising a material having a higher affinity for oxygen than a material of the compound semiconductor layer, the oxygen gettering layer including at least one of a doped Zr, a metal sulfide, and a metal nitride;
  forming a dielectric layer on the oxygen gettering layer; and
  forming an electrode on the dielectric layer, the dielectric layer being between the electrode and the oxygen gettering layer.

10. The method of claim 9, wherein the doped Zr comprises at least one of Y-doped Zr and Al-doped Zr.

11. The method of claim 9, wherein the metal sulfide comprises at least one of $HfS_2$, $TiS_2$, $LaS_x$, and $SiS_2$.

12. The method of claim 9, wherein the metal nitride comprises at least one of AlN, GaN, HfN, and SiN.

13. The method of claim 9, wherein the forming an oxygen gettering layer includes using an atomic layer deposition (ALD) method, a chemical vapor deposition (CVD) method, or a sputtering method.

14. The method of claim 13, further comprising:
  performing a thermal treatment on at least one of the oxygen gettering layer and the dielectric layer.

15. The method of claim 9, further comprising:
  forming a passivation layer on a surface of the compound semiconductor layer before the forming an oxygen gettering layer.

16. The method of claim 15, wherein the passivation layer comprises at least one of S, N, F, Cl and H formed on the surface of the compound semiconductor layer.

17. The semiconductor device of claim 1, wherein the oxygen gettering layer is directly on the compound semiconductor layer.

18. The semiconductor device of claim 1, wherein the oxygen gettering layer has a higher affinity for oxygen than the compound semiconductor layer and the dielectric layer.

* * * * *